United States Patent
McCullough et al.

(10) Patent No.: US 6,976,769 B2
(45) Date of Patent: Dec. 20, 2005

(54) LIGHT-EMITTING DIODE REFLECTOR ASSEMBLY HAVING A HEAT PIPE

(75) Inventors: Kevin McCullough, North Kingstown, RI (US); James Miller, Marietta, GA (US); E. Mikhail Sagal, Wakefield, RI (US)

(73) Assignee: Cool Options, Inc., Warwick, RI (US)

( * ) Notice: Subject to any disclaimer, the term of this patent is extended or adjusted under 35 U.S.C. 154(b) by 208 days.

(21) Appl. No.: 10/459,234

(22) Filed: Jun. 11, 2003

(65) Prior Publication Data

US 2004/0252502 A1    Dec. 16, 2004

(51) Int. Cl.[7] .............................................. F21V 7/20
(52) U.S. Cl. ...................... 362/345; 362/294; 362/373; 362/547
(58) Field of Search .............................. 362/26, 27, 97, 362/218, 238, 240, 241, 294, 341, 345, 373, 362/555, 580, 516, 519, 547–549, 545, 800, 362/541

(56) References Cited

U.S. PATENT DOCUMENTS

| | | | |
|---|---|---|---|
| 3,498,371 A | 3/1970 | Zygiel | |
| 3,834,458 A | 9/1974 | Bilbro et al. ................. | 165/164 |
| 4,660,625 A | 4/1987 | Musinski ...................... | 165/47 |
| 4,697,784 A | 10/1987 | Schmid ......................... | 249/119 |
| 5,059,373 A | 10/1991 | Hirabayashi ................. | 264/154 |
| 5,119,174 A | 6/1992 | Chen ............................ | 357/80 |
| 5,167,556 A | 12/1992 | Stein ............................ | 445/24 |
| 5,697,428 A | 12/1997 | Akachi ................... | 165/104.21 |
| 5,727,619 A | 3/1998 | Yao et al. ............... | 165/104.33 |
| 5,754,338 A * | 5/1998 | Wilson et al. ............... | 359/530 |
| 5,865,530 A * | 2/1999 | Weber .......................... | 362/341 |
| 5,895,302 A | 4/1999 | Chen-Lun et al. ............. | 445/23 |
| 5,916,496 A * | 6/1999 | Weber ......................... | 264/1.9 |
| 5,945,775 A * | 8/1999 | Ikeda et al. .................. | 313/113 |
| 6,050,331 A | 4/2000 | Breault ........................ | 165/168 |
| 6,065,529 A | 5/2000 | Antoniuk et al. ............. | 165/46 |
| 6,148,906 A | 11/2000 | Li et al. ................. | 165/104.33 |
| 6,251,978 B1 * | 6/2001 | McCullough ................ | 524/404 |
| 6,318,886 B1 | 11/2001 | Stopa et al. ................. | 362/555 |
| 6,478,997 B2 | 11/2002 | McCullough ................ | 264/108 |
| 6,773,154 B2 * | 8/2004 | Desai ........................... | 362/541 |
| 6,786,620 B1 * | 9/2004 | Takezawa .................... | 362/345 |
| 6,827,468 B2 * | 12/2004 | Galli ........................... | 362/294 |
| 2001/0023762 A1 | 9/2001 | Sagal .......................... | 165/185 |
| 2003/0227774 A1 * | 12/2003 | Martin et al. ................ | 362/240 |

FOREIGN PATENT DOCUMENTS

JP          54036899          3/1979
WO       WO 99/26286          5/1999

* cited by examiner

Primary Examiner—Stephen Husar
Assistant Examiner—Hargobind S. Sawhney
(74) Attorney, Agent, or Firm—Barlow, Josephs & Holmes, ltd.

(57) ABSTRACT

A light-emitting diode reflector assembly having a heat pipe and a reflector body is provided. The assembly further includes a mounting member for mounting a circuit board having an array of light-emitting diodes. The mounting member and reflector body are made from a thermally-conductive polymer composition comprising: i) about 20% to about 80% by weight of a base polymer matrix such as polycarbonate; and ii) about 20% to about 80% by weight of a thermally-conductive material such as carbon graphite.

23 Claims, 3 Drawing Sheets

LIGHT-EMITTING DIODE REFLECTOR ASSEMBLY HAVING A HEAT PIPE

BACKGROUND OF THE INVENTION

The present invention generally relates to a light-emitting diode reflector assembly having a heat pipe and a reflector body. The assembly further includes a mounting member for mounting a circuit board having an array of light-emitting diodes. The mounting member and reflector body are made from a thermally-conductive polymer composition that can dissipate heat from the light-emitting diodes (LEDs).

LEDs are used in many different applications for generating high intensity light beams. For example, automotive headlights, tail lamps, flashlights, search lights, and other lighting devices may employ an array of LEDs as its lighting source. The individual LEDs are closely spaced apart from each other and can generate light beams at a high luminous flux. It is known that the intensities of the light beams generated by the LED array and service life of the LED array are based on the energization current which flows through the device. It is further known that LED arrays generate a tremendous amount of heat which must be removed in order for the device to function properly. The industry has attempted to address the problem of removing heat from the LED arrays using heat sink materials.

For example, Stopa et al., U.S. Pat. No. 6,318,886 discloses a heat sink assembly for an array of light-emitting diodes. The heat sink assembly includes a reflector subassembly including a plurality of frustoconical reflectors arranged in rows and columns. The '886 patent discloses that the assembly can comprise a molded plastic having a metallized reflective coating. The reflector subassembly and plural light-emitting diodes (LEDs) are supported on a molded base comprising a thermally-conductive plastic such as filled polycarbonate. The body of the LED is mounted on a printed circuit board by means of a thermally and electrically conductive adhesive. The faces of the printed circuit board are provided with layers of copper.

Chen, U.S. Pat. No. 5,119,174 discloses a light-emitting diode (LED) display having a printed circuit board base. On the printed circuit board, each die attach zone for the LED is punched with a bowl-shaped reflector surface. When the LED is powered on to emit light, the accompanying heat can be rapidly conducted between a copper foil on the die attach zone and a copper foil disposed on the rear surface of the printed circuit board.

Heat sink structures having heat pipes for removing heat from various heat-generating devices are also known. For example, heat can be removed from an electronic package or integrated circuit chip such as a central processing unit (CPU,) microprocessor chips, or random access memory (RAM) chip to a heat sink structure having a heat pipe embedded therein. As heat is conducted to the heat sink structure, the heat vaporizes the working fluid in one end of the heat pipe (evaporator end). The vapors are then condensed at the other end of the heat pipe (condenser end) transferring heat to the heat sink structure.

For instance, Antoniuk et al., U.S. Pat. No. 6,065,529 discloses a heat pipe assembly having a heat pipe disposed in a host structure for conducting heat away from a heat generating body on a space or terrestrial platform. A heat conductive fluid is injected into the gap between the outside surface wall of the heat pipe and the channel within the host structure.

McCullough, U.S. Pat. No. 6,478,997 discloses a heat pipe having a core of carbon fibers and an outer Jacket of a polymer material such as polyethylene. The heat pipe is produced by first preparing a mixture comprising a base polymer matrix and carbon fibers. Then, the mixture is extruded through an extrusion die and cooled.

Although the above-described conventional heat sink assemblies may be somewhat effective in removing heat from heat-generating LEDs in some instances, there is still a need for an improved thermally-conductive assembly. The assembly should be capable of dissipating heat rapidly and efficiently so that the LED devices are not thermally damaged. The present invention provides such an LED reflector assembly.

In addition, many LED assemblies contain reflective surfaces to reflect the light beams generated by the LEDs. The reflective surface is typically coated with a light-reflective metal, such as aluminum, silver, or chromium. The industry attempts to make such reflective surfaces smooth so that the metallized, reflective coating can be uniformly deposited on the surface of the article. However, many conventional LED reflector assemblies do not have smooth surfaces which easily receive metallized, light-reflecting coatings. The present invention provides an assembly having a relatively smooth surface that can be coated easily with a metallized, reflective coating. These and other objects, features, and advantages of the invention are evident from the following description and attached figures.

SUMMARY OF THE INVENTION

The present invention relates to light-emitting diode (LED) reflector assemblies. The assembly comprises: a) a reflector body having a recessed portion with a light-reflecting surface; b) a circuit board-mounting member which is connected to the reflector body; and c) a circuit board having an array of light-emitting diodes mounted to the mounting member. The circuit board-mounting member comprises an elongated heat sink component containing a heat pipe embedded therein. The light-emitting diodes impinge light beams onto the light-reflecting surface of the reflector body.

The reflector body comprises a first thermally-conductive polymer composition, and the circuit board-mounting member comprises a second thermally-conductive polymer composition. Preferably, the first and second polymer compositions are the same. The polymer composition comprises: a) about 20% to about 80% by weight of a base polymer matrix; and b) about 20% to about 80% by weight of a thermally-conductive material.

The thermally-conductive material can be a metal, metal oxide, ceramic, carbon material, or other suitable material. For example, the thermally-conductive filler can be aluminum, copper, magnesium, brass, alumina, zinc oxide, boron nitride, or carbon graphite. The thermally-conductive material can be used in any suitable form. For example, graphite, carbon black particles, and carbon fibers can be used.

The polymer composition may further comprise about 5% to about 30% of a reinforcing material such as glass to strengthen the polymer matrix. Additives such as antioxidants, plasticizers, stabilizers, dispersing agents, coloring agents, and mold-releasing agents can be incorporated into the composition. In a preferred embodiment, the polymer composition comprises about 74 weight % polycarbonate, about 24 weight % graphite, and about 1 weight % mold-releasing agent.

BRIEF DESCRIPTION OF THE DRAWINGS

The novel features that are characteristic of the present invention are set forth in the appended claims. However, the preferred embodiments of the invention, together with further objects and attendant advantages, are best understood by reference to the following detailed description taken in connection with the accompanying drawings in which:

DETAILED DESCRIPTION OF THE PREFERRED EMBODIMENTS

The present invention relates to light-emitting diode (LED) reflector assemblies and methods for making such assemblies.

Figure 1:
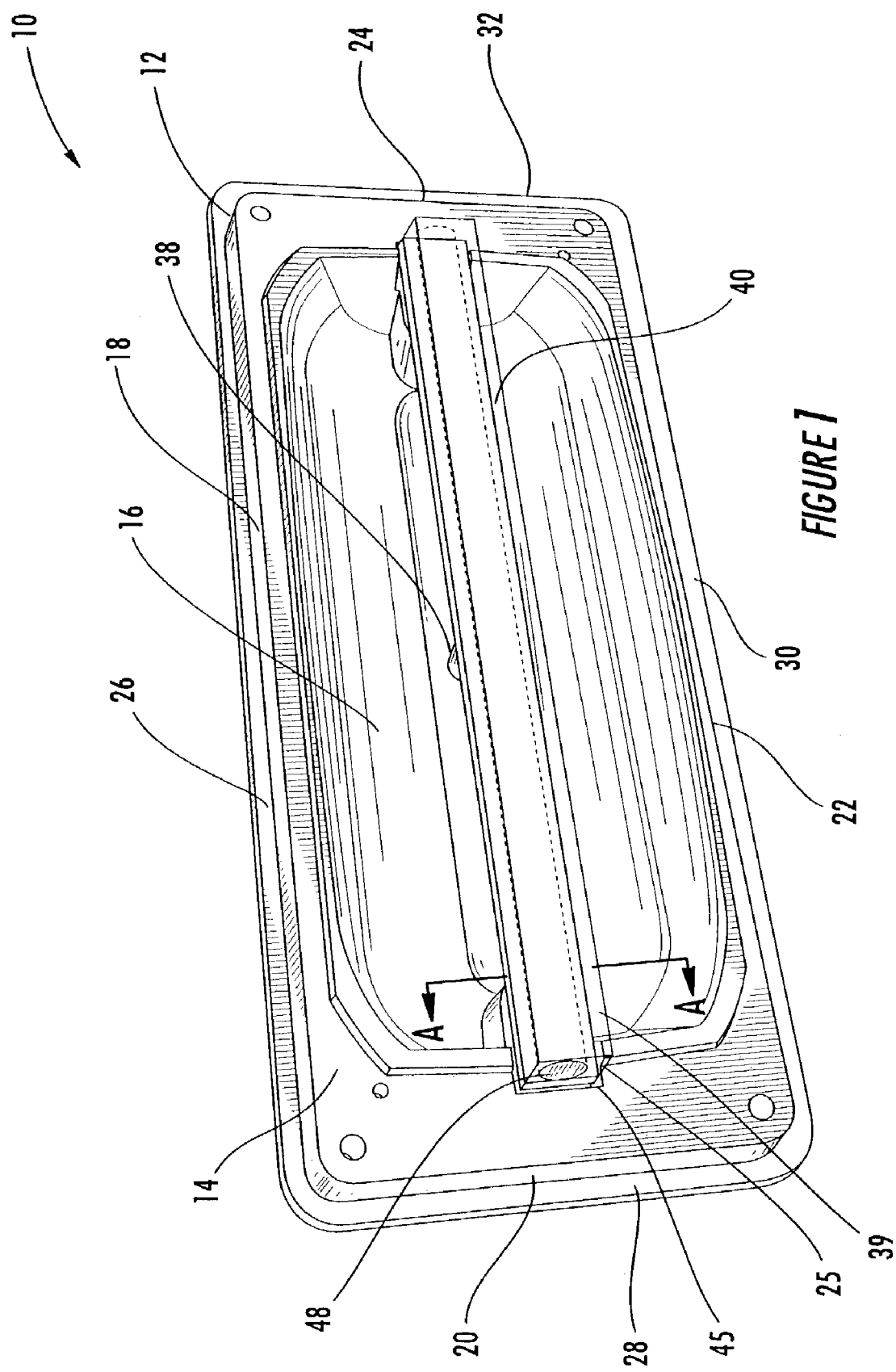
FIG. 1 is a perspective view of a light-emitting diode reflector assembly made in accordance with the present invention.

Referring to FIG. 1, the light-emitting diode reflector assembly of the present invention is generally indicated at 10. The assembly 10 includes a reflector body 12 having a rectangular-like shape. The body 12 comprises a generally planar rear or bottom surface (not shown) and a front or top surface 14 containing a recessed area 16 which extends along a substantial portion of the body 12. The reflector body 12 includes sidewall portions 18, 20, 22, and 24 and flanged sections 26, 28, 30, and 32 which extend outwardly from the edges of the sidewall portions. If the assembly 10 is fastened to a substrate, for example an automotive panel (not shown), the rear surface and flanged sections 26, 28, 30, and 32 engage the substrate.

Figure 3:
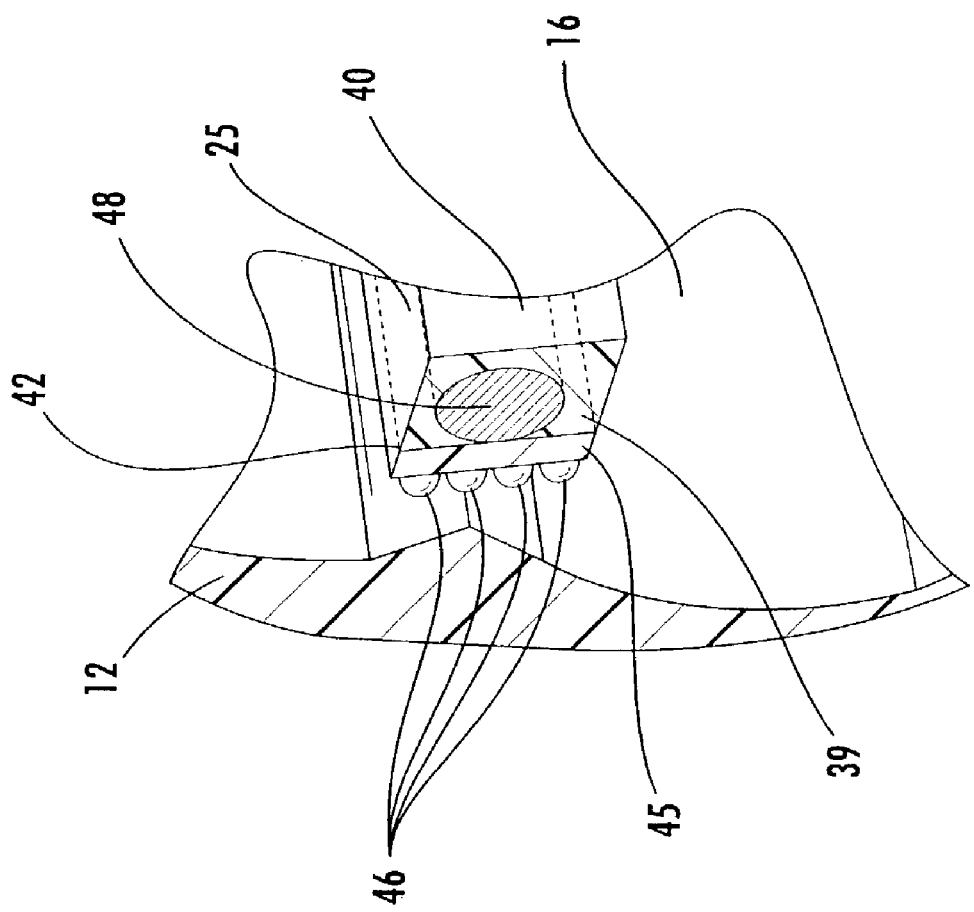
FIG. 3 is a cross-sectional view of a light-emitting diode reflector assembly of the present invention shown through line A—A in FIG. 1.

The recessed area 16 includes mounting holes (not shown) and mounting pin element 38. The assembly includes a circuit board-mounting member 25 comprising an elongated beat sink component having a first (upper) surface 40 and a second (lower) surface 42 (FIG. 3). The circuit board-mounting member 25 extends across the length of the recessed area 16 of the reflector body 12. The mounting member 25 is connected to the reflector body 12 at the mounting holes and mounting pin 38. Plastic fasteners, screws, bolts, or other suitable fastening means can be inserted through the mounting holes so that the mounting member 25 is fastened securely to the reflector body 12.

A circuit board 45 containing an array of LEDs 46 (FIG. 3) is surface mounted to the lower surface 42 of the mounting member 25. The circuit board 45 may be attached to the lower surface 42 of the mounting member 25 by known methods in the art such as thermally and electrically conductive adhesives. In a similar manner, the LEDs 46 may be mounted on the circuit board 45 using thermally and electrically conductive adhesives or other suitable fastening means.

As described above, the circuit board-mounting member 25 includes an elongated heat sink component 39 having an upper 40 and lower 42 outer surface. The mounting member 25 further contains a heat pipe 48 embedded therein. The heat pipe 48 extends longitudinally within the mounting member 25. The heat pipe 48 is an important element of the reflector assembly 10 as discussed in further detail below. The heat pipe 48 is typically charged with a phase change media such as water or ammonia as is known in the art. In accordance with the present invention, the heat-generating LEDs 46 heat up the phase change media located within one region of the heat pipe 48 to a vapor state. The vapors then naturally migrate toward a cooler region of the heat pipe 48, where the vapors are condensed. As a result, the heat is transferred from one point to another point in the heat pipe 48 and to the elongated heat sink component 39.

Figure 2:
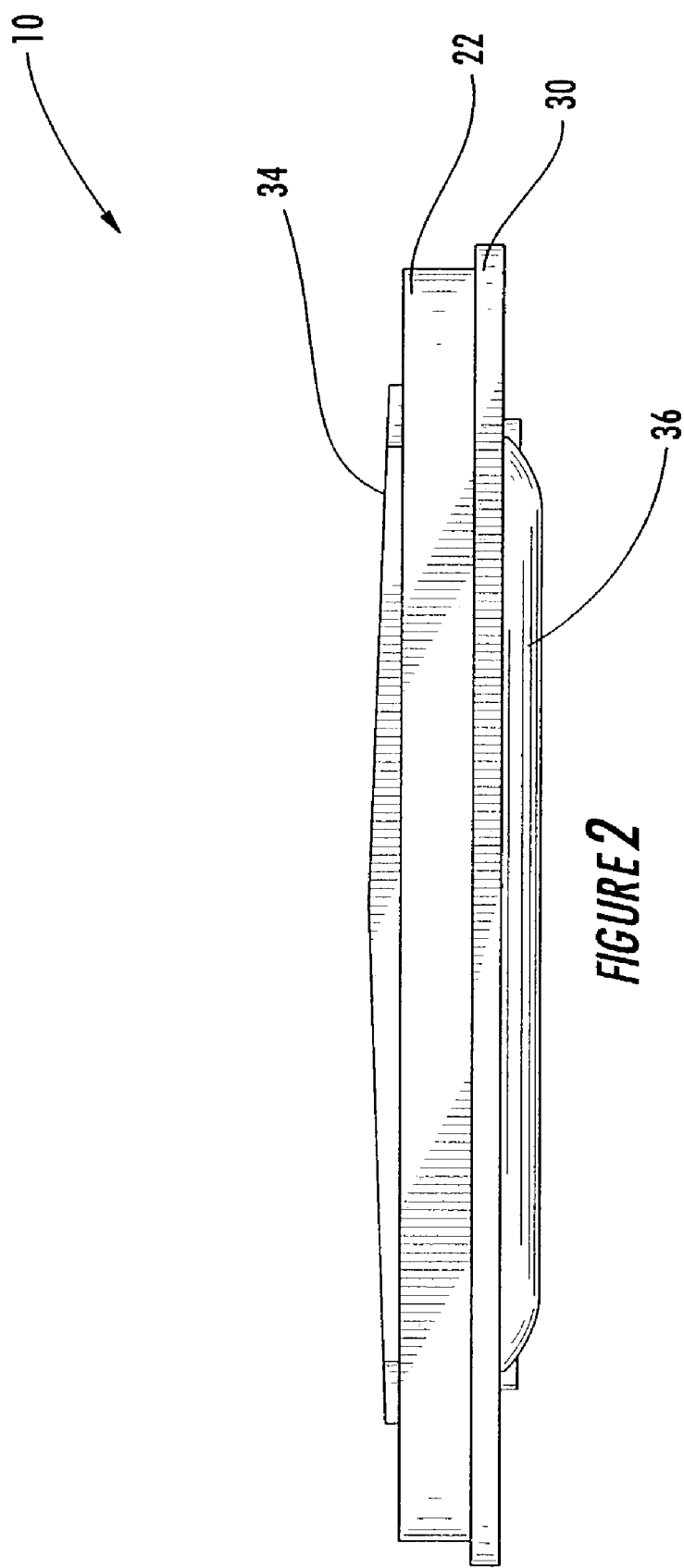
FIG. 2 is a side perspective view of the light-emitting diode reflector assembly shown in FIG. 1 equipped with a cover.

As shown in FIG. 2, a cover or lid 34 may be fastened to the reflector body 12 so that it extends over the recessed portion 16 of the body 12. The cover 34 protects the entire assembly 10, particularly the array of LEDs. The cover 34 can be transparent so that light transmitted by the LEDs is visible. In FIG. 2, the planar rear surface 36 of the reflector assembly 10 is also shown.

FIG. 3 is a cross-sectional view of the reflector assembly 10 through line A—A in FIG. 1. As shown in FIG. 3, circuit board-mounting member 25 extends longitudinally across the length of the recessed area 16 of the reflector body 12. Also, the upper surface 40 and lower surface 42 of the mounting member 25 are shown. The circuit board 45 is shown surface-mounted to the lower surface 42 of the mounting member 25. The circuit board 45 contains an array of heat-generating LEDs 46.

A first thermally-conductive composition is used to make the reflector body 12, and a second thermally-conductive composition is used to make the mounting member 25. The first and second polymer compositions may include the same or different ingredients. Preferably, the first and second polymer compositions are the same. The composition contains a base polymer matrix and thermally-conductive filler material. Thermoplastic polymers such as polycarbonates, polyethylene, polypropylene, acrylics, vinyls, fluorocarbons, polyamides, polyphenylene sulfide, and liquid crystal polymers such as thermoplastic aromatic polyesters, can be used to form the matrix. Alternatively, thermosetting polymers such as elastomers, epoxies, polyesters, polyimides, and acrylonitriles can be used as the matrix. Suitable elastomers include, for example, styrene-butadiene copolymer, ethylene-propylene terpolymers, polysiloxanes (silicones), and polyurethanes. Polycarbonates are preferred due to their ability to be easily molded into shaped articles. Furthermore, polycarbonates are substantially non-corrosive and have good weather and ozone resistance. In addition, polycarbonates are dimensionally stable and have high impact strength. Generally, the base polymer matrix comprises about 20 to about 80% by weight of the total composition and more particularly about 40 to about 80% by weight of the composition.

In the present invention, thermally-conductive materials are added to the base polymer matrix. The thermally-conductive material imparts thermal conductivity to the non-conductive polymer matrix. Suitable thermally-conductive materials include, for example, metals such as aluminum, copper, silver, nickel, magnesium, brass; metal oxides such as alumina, magnesium oxide, zinc oxide, and titanium oxide; ceramics such as silicon nitride, aluminum nitride, boron nitride, boron carbide; and carbon materials such as carbon black and graphite; and the like. Mixtures of such fillers are also suitable.

Preferably, a carbon material such as carbon black, graphite, or fiber is added to the base polymer matrix. In the present invention, graphite is particularly preferred due to its high thermal conductivity and mechanical strength. Generally, the thermally-conductive materials comprise about 20 to about 80% by weight of the total composition and more particularly about 20 to about 60% by weight of the composition.

The thermally-conductive material can be in the form of particles, granular powder, whiskers, fibers, or any other suitable form. The particles or granules can have a variety of structures and a broad particle size distribution. For example, the particles or granules can have flake, plate, rice, strand, hexagonal, or spherical-like shapes with a particle size in the range of 0.5 to 300 microns.

In some instances, the thermally-conductive material can have a relatively high aspect (length to thickness) ratio of about 10:1 or greater. For example, PITCH-based carbon fiber having an aspect ratio of about 50:1 can be used. Alternatively, the thermally-conductive material can have a relatively low aspect ratio of about 5:1 or less. For example, boron nitride particles having an aspect ratio of about 4:1 can be used. Both low aspect and high aspect ratio filler materials can be added to the base polymer matrix as described in McCullough, U.S. Pat. No. 6,048,919, the disclosure of which is hereby incorporated by reference. Particularly, the compositions of this invention can contain about 25 to about 60% by weight of a thermally-conductive material having a high aspect ratio of about 10:1 or greater, and about 10 to about 25% by weight of a thermally-conductive material having a low aspect ratio of about 5:1 or less.

An optional reinforcing material can be added to the polymer matrix. The reinforcing material can be glass, inorganic minerals, or other suitable material. The reinforcing material strengthens the polymer matrix and provides the molded article with greater mechanical strength and integrity. The reinforcing material, if added, constitutes about 5 to about 30% by weight of the composition. Also, if desired, the polymeric mixture may contain additives such as, for example, flame retardants, antioxidants, plasticizers, dispersing aids, coloring agents, and mold-releasing agents. Examples of mold-releasing agents which can be used in accordance with this invention include metal stearates such as calcium or zinc stearate.

In one preferred embodiment of the present invention, the polymer composition comprises about 74 weight % polycarbonate, about 24 weight % graphite, and about 1 weight % mold-releasing agent based on the weight of the composition.

The thermally-conductive material and optional additives (such as the mold-releasing agent and reinforcing glass) are intimately mixed and dispersed within the non-conductive polymer matrix to form the polymer composition. The mixture can be prepared using techniques known in the art. The ingredients should be mixed under low shear conditions in order to avoid damaging the structures of the thermally-conductive materials.

Significantly, the polymer compositions used to make the LED reflector assemblies of this invention have a thermal conductivity of greater than 10 W/m° K. These good heat conduction properties are critical for making an improved reflector assembly that can better dissipate heat from the heat-generating LEDs.

The circuit board-mounting member containing the heat pipe embedded therein is made using an insert molding process. The process involves inserting a heat pipe within the mold. Conventional heat pipe devices can be used in accordance with the present invention. The thermally-conductive composition is injected into the mold so that the composition surrounds and is disposed about the heat pipe. The composition fills the mold around the inserted heat pipe. In this manner, the thermally-conductive composition forms a molded, elongated heat sink component having upper and lower surfaces. The molded heat sink component contacts the embedded heat pipe at several points and forms a tightly conforming interface with the heat pipe. In general, the mounting member can be considered to have a sheath/core structure, wherein a sheath of thermally-conductive polymer composition forms an elongated heat sink component surrounding a heat pipe core. This structure allows the heat sink component and heat pipe to thermally communicate with each other. Heat can be efficiently transferred between the heat sink component and heat pipe.

The reflector body 12 of the reflector assembly is made using an injection-molding process. Conventional injection-molding machines can be used. The injection-molding process generally involves loading pellets of the thermally-conductive polymer composition into a hopper. The hopper funnels the pellets into a heated extruder (barrel), wherein the pellets are heated to form a molten composition (liquid plastic). The extruder feeds the molten polymer composition into a chamber containing an injection piston. The piston moves forward and forces a shot of the molten composition into a mold. Typically, the mold contains two molding sections that are aligned together in such a way that a molding chamber or cavity is located between the sections. The molten material remains in the mold under high pressure until it cures and cools. Then, the molded reflector body is removed from the mold.

The molding process parameters can be adjusted depending on the desired molded reflector body that will be produced in accordance with this invention. For example, the heated barrel temperature can be adjusted to help control the viscosity of the molten material. If the barrel temperature is too cool, the material tends to have a high viscosity and this can lead to processing difficulties. If the barrel temperature is too hot, the material can gel. The barrel residence time is also important to maintain a homogeneous mixture that can be injected into the mold. The injection pressure, injection speed (flow rate of the composition), hold pressure in the mold, mold temperature, and cure time can be adjusted accordingly.

The injection speed and flow rate of the molten composition into the mold are important. If the injection speed and flow rate are too slow, the surface of the molded reflector body can be rough and pitted. This rough surface can be caused by the thermally-conductive particles in the composition separating and migrating to the surface of the reflector body. Many conventional polymer compositions have relatively slow flow rates and can produce rugged, uneven surfaces when the compositions are injection-molded. However, the polymer compositions of the present invention are characterized by having a relatively high flow rate. The thermally-conductive materials are completely and uniformly dispersed within the polymer composition, thus making the composition more fluid. The composition tends to flow smoothly and rapidly into the mold sections, thereby producing a molded reflector body having a substantially smooth and glossy-like surface.

The reflector assembly of the present invention is characterized by having a reflector body which is relatively smooth and glossy. The surface is substantially free of pits, jagged points, or other surface defects. The smooth surface of the reflector article means that the surface can be coated easily with a metallized reflective coating.

The surface of the reflector body is coated with a light-reflecting metal. The application of the coating typically is carried out using a vacuum-coating process known in the art. These vacuum-coating methods involve vacuum-depositing liquid metal onto the surface of the reflector article. The liquid metal is evaporated onto the surface of the article at a desired thickness. Suitable light-reflective metals include, for example, aluminum, silver, chromium, nickel, platinum, and alloys thereof. Also, colored metals such as copper and gold and metallic compounds such as brass and titanium nitride can be used. Aluminum and silver are most commonly used. The thickness of the metallized, reflective coating can be adjusted depending on the intended end-use application of the reflector assembly.

A protective transparent film can be then applied over the reflective, metallized coating using the vacuum-coating method. The transparent film can comprise inorganic oxides such as silicon dioxides; glass; and ceramics. The protective film prevents the degradation of the metallized, reflective layer. Acrylic resins can also be used. The acrylic resins can be sprayed onto the surface rather than vacuum-coated.

The thermally-conductive LED reflector assemblies of the present invention have many advantageous features over conventional LED reflector assemblies including the following. First, the circuit board-mounting member having an elongated heat sink component including an embedded heat pipe is particularly effective at removing heat from the heat-generating array of LEDs.

Secondly, the reflector assemblies have a reflector body which has a relatively smooth and glossy-like surface. The surface can be uniformly coated with a metallized light-reflecting layer. The reflective coating, which is applied to the smooth surface of the reflector body, is thus able to accurately and completely reflect light that is directed onto the surface.

In addition, the reflector assemblies of the present invention have improved thermal conductivity properties. Preferably, the assemblies have a thermal conductivity of greater than 10 W/m° K. Referring to FIG. 1, these heat transfer properties allow the reflector body 12 to remove heat from the enclosed recessed portion 16, wherein heat generated from the array of LEDs can build up quickly. The molded reflector body 12 efficiently dissipates the heat and prevents overheating of this enclosed area 16.

Further, the reflector bodies can be net-shape molded meaning that the final shape of the body is determined by the shape of the mold cavity. No additional processing, die-cutting, machining, or other tooling is required to produce the final shape of the article.

It is appreciated by those skilled in the art that various changes and modifications can be made to the description and illustrated embodiments without departing from the spirit of the present invention. All such modifications and changes are intended to be covered by the appended claims.

What is claimed is:

1. An injection molded light-emitting diode reflector assembly formed from polymer materials, comprising:
   a reflector body having a recessed portion with a light-reflecting surface and a peripheral sidewall surrounding said recessed portion, said reflector body comprising a first thermally-conductive polymer composition;
   a circuit board-mounting member extending across said reflector body between two spaced apart points on said side wall in spaced relation to said light reflecting surface, said mounting member including
      an elongated heat sink component having an upper and lower outer surface, said component comprising a second thermally-conductive polymer composition; and
      a heat pipe embedded in the heat sink component; and
   a circuit board mounted to the lower surface of the mounting member, said circuit board having an array of light-emitting diodes mounted thereon that direct light beams onto the light-reflecting surface of the reflector body.

2. The reflector assembly of claim 1, wherein the first and second thermally-conductive polymer compositions are the same.

3. The reflector assembly of claim 1, wherein said first and second thermally conductive polymer compositions comprise: a) about 20% to about 80% by weight of a base polymer matrix; and b) about 20% to about 80% by weight of a thermally-conductive filler material.

4. The reflector assembly of claim 3, wherein the polymer matrix comprises a thermoplastic polymer.

5. The reflector assembly of claim 4, wherein the thermoplastic polymer is selected from the group consisting of polycarbonates, polyethylene, polypropylene, acrylics, vinyls, fluorocarbons, polyamides, polyphenylene sulfide, and liquid crystal polymers.

6. The reflector assembly of claim 3, wherein the polymer matrix comprises a thermosetting polymer.

7. The reflector assembly of claim 6, wherein the thermosetting polymer is selected from the group consisting of elastomers, epoxies, polyesters, polyimides, and acrylonitriles.

8. The reflector assembly of claim 3, wherein the thermally-conductive filler material is a metal, metal oxide, ceramic, or carbon material.

9. The reflector assembly of claim 8, wherein the thermally-conductive filler material is selected from the group consisting of aluminum, copper, magnesium, brass, alumina, magnesium oxide, silicon nitride, boron nitride, carbon black, and carbon graphite.

10. The reflector assembly of claim 3, wherein the polymer composition further comprises about 5 to about 30% by weight of a reinforcing material.

11. The reflector assembly of claim 10, wherein the reinforcing material is glass.

12. The reflector assembly of claim 3, wherein the polymer composition further comprises an additive selected from the group consisting of antioxidants, plasticizers, stabilizers, dispersing agents, coloring agents, and mold-releasing agents.

13. The reflector assembly of claim 3, wherein the polymer composition comprises about 74% by weight of polycarbonate, about 24% by weight of carbon graphite, and about 1% by weight of a mold-releasing agent.

14. The reflector assembly of claim 1, wherein the reflector body has a thermal conductivity of greater than 10 W/m° K.

15. A method for making an injection molded light-emitting diode reflector assembly, comprising the steps of:
   providing a first molten polymer composition, said composition formed from about 20% to about 80% by weight of a base polymer matrix and about 20% to about 80% by weight of a thermally-conductive filler material;
   injecting the first molten polymer composition into a mold to form a thermally-conductive reflector body having a recessed portion with a light-reflecting surface and a peripheral side wall surrounding said recessed portion;
   providing a second molten polymer composition, said composition formed from about 20% to about 80% by weight of a base polymer matrix and about 20% to about 80% by weight of a thermally-conductive filler material;
   injecting the second molten polymer composition into a mold having an inserted heat pipe to form a circuit board-mounting member comprising an elongated heat sink component having an upper and lower outer surface, and embedded heat pipe;

mounting a circuit board having an array of light-emitting diodes mounted thereon to the lower surface of the mounting member; and connecting the mounting member to the reflector body, said mounting member extending across said reflector body between two spaced apart points on said side wall in spaced relation to said light reflecting surface, thereby forming a light-emitting diode reflector assembly.

16. The method of claim 15, wherein the first and second thermally-conductive polymer compositions are the same.

17. The method of claim 16, wherein the polymer matrix comprises a thermoplastic polymer.

18. The method of claim 16, wherein the polymer matrix comprises a thermosetting polymer.

19. The method of claim 16, wherein the thermally-conductive filler material is a metal, metal oxide, ceramic, or carbon material.

20. The method of claim 19, wherein the thermally-conductive filler material is selected from the group consisting of aluminum, copper, magnesium, brass, alumina, magnesium oxide, silicon nitride, boron nitride, carbon black, and carbon graphite.

21. The method of claim 16, wherein the polymer composition further comprises about 5 to about 30% by weight of a reinforcing material.

22. The method of claim 16, wherein the polymer composition further comprises an additive selected from the group consisting of antioxidants, plasticizers, stabilizers, dispersing agents, coloring agents, and mold-releasing agents.

23. The method of claim 16, wherein the polymer composition comprises about 74% by weight of polycarbonate, about 24% by weight of carbon graphite, and about 1% by weight of a mold-releasing agent.

* * * * *